(12) United States Patent
Chiang

(10) Patent No.: US 10,009,060 B2
(45) Date of Patent: Jun. 26, 2018

(54) SWITCHABLE FILTERING CIRCUIT AND THE OPERATION METHOD USING THE SAME

(71) Applicant: Microchip Technology Incorporated, Chandler, AZ (US)

(72) Inventor: Kuei-Ju Chiang, Hsinchu (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 16 days.

(21) Appl. No.: 14/994,928

(22) Filed: Jan. 13, 2016

(65) Prior Publication Data

US 2016/0134258 A1    May 12, 2016

Related U.S. Application Data

(63) Continuation of application No. 13/933,969, filed on Jul. 2, 2013.

(30) Foreign Application Priority Data

Oct. 9, 2012  (TW) .............................. 101137325 A

(51) Int. Cl.
*H04B 1/48* (2006.01)
*H04B 1/44* (2006.01)
(Continued)

(52) U.S. Cl.
CPC .............. *H04B 1/48* (2013.01); *H03H 11/12* (2013.01); *H03H 11/1291* (2013.01);
(Continued)

(58) Field of Classification Search
USPC ................................................ 455/552–559
See application file for complete search history.

(56) References Cited

U.S. PATENT DOCUMENTS 4,980,660 A * 12/1990 Nakamura ................. H01P 1/10
                                                              333/101
5,590,412 A * 12/1996 Sawai .................... H03F 3/1935
                                                              330/282
(Continued)

FOREIGN PATENT DOCUMENTS

CN    101447773 A    6/2009    ............... H03H 7/12
CN    101764587 A    6/2010    ............... H03H 7/12
(Continued)

OTHER PUBLICATIONS

"Dual, Matched Precision Operational Amplifier," Datasheet, Linear Technology Corporation, 16 pages, 1985.
(Continued)

*Primary Examiner* — Gennadiy Tsvey
(74) *Attorney, Agent, or Firm* — Slayden Grubert Beard PLLC

(57) ABSTRACT

The disclosure provides a switchable filtering circuit and the related operation method, in particular related to a filtering circuit which can be used for Bluetooth system and wireless local area network system. By using a first switch, a hybrid filtering circuit and a second switch, the received mode and transmitted mode between these two systems is realized. Moreover, the frequency responses and the bandwidth adjustments can be controlled according to the plurality of switchable resistors, the plurality of switchable capacitors and the shared and switchable resistors within the hybrid filter circuit. Moreover, the effects of high operated freedom of the circuit and the circuit size reduction can be achieved.

19 Claims, 6 Drawing Sheets

(51) Int. Cl.
  *H04B 15/00* (2006.01)
  *H03H 11/34* (2006.01)
  *H04B 1/401* (2015.01)
  *H04B 1/18* (2006.01)
  *H04B 1/403* (2015.01)
  *H03H 11/12* (2006.01)
  *H04W 4/00* (2018.01)
  *H03H 11/04* (2006.01)
  *H04W 84/12* (2009.01)

(52) U.S. Cl.
  CPC .............. *H03H 11/34* (2013.01); *H04B 1/18* (2013.01); *H04B 1/401* (2013.01); *H04B 1/403* (2013.01); *H04B 1/44* (2013.01); *H04B 15/00* (2013.01); *H04W 4/008* (2013.01); *H03H 2011/0494* (2013.01); *H04W 84/12* (2013.01)

(56) References Cited

U.S. PATENT DOCUMENTS

| | | | | |
|---|---|---|---|---|
| 5,701,594 A | * | 12/1997 | Bath | H04B 1/403 370/280 |
| 5,729,438 A | | 3/1998 | Pieper et al. | 361/760 |
| 6,466,613 B1 | * | 10/2002 | Raphaeli | H04B 3/54 375/219 |
| 6,510,309 B1 | * | 1/2003 | Thompson | H03G 1/0088 455/73 |
| 7,720,443 B2 | * | 5/2010 | Toncich | H04B 1/44 370/280 |
| 7,982,533 B2 | * | 7/2011 | Fan | H03H 11/22 327/552 |
| 8,089,310 B2 | | 1/2012 | Iida et al. | 327/551 |
| 8,390,370 B2 | | 3/2013 | Iida et al. | 327/554 |
| 8,918,063 B2 | | 12/2014 | Song et al. | 455/83 |
| 2002/0151281 A1 | * | 10/2002 | Izadpanah | H04B 1/44 455/83 |
| 2005/0048928 A1 | | 3/2005 | Jeon et al. | 455/78 |
| 2005/0136846 A1 | * | 6/2005 | Kim | H04B 1/28 455/78 |
| 2006/0178165 A1 | * | 8/2006 | Vassiliou | H04B 1/30 455/552.1 |
| 2007/0040605 A1 | | 2/2007 | Fan et al. | 327/554 |
| 2007/0132507 A1 | | 6/2007 | Gatta et al. | 327/552 |
| 2008/0232279 A1 | * | 9/2008 | Marholev | H04B 1/403 370/280 |
| 2010/0297961 A1 | * | 11/2010 | Chien | H04B 1/1027 455/84 |
| 2011/0021162 A1 | | 1/2011 | Song et al. | 455/83 |
| 2012/0177150 A1 | | 7/2012 | Liu et al. | 375/334 |

FOREIGN PATENT DOCUMENTS

| | | | |
|---|---|---|---|
| CN | 102594751 A | 7/2012 | ............. H04L 27/14 |
| KR | 20110007385 A | 1/2011 | ............. H04B 1/44 |

OTHER PUBLICATIONS

Chinese Office Action, Application No. 201210415966.2, 14 pages, dated Nov. 13, 2015.

* cited by examiner

SWITCHABLE FILTERING CIRCUIT AND THE OPERATION METHOD USING THE SAME

RELATED PATENT APPLICATION

This application is a continuation of U.S. patent application Ser. No. 13/933,969 filed Jul. 2, 2013, which claims priority to TW Patent Application No. 101137325 filed on Oct. 9, 2012, all of which are hereby incorporated by reference herein for all purposes.

TECHNICAL FIELD

The disclosure relates to a filtering circuit and the operation method using the same, and in particular to a switchable filtering circuit for receiving and transmitting the signals of Bluetooth system and wireless local area network system.

BACKGROUND

The filter design plays an important role in the communication system. An ideal received filter can minimize the distortion of the signals and filter the interference out of band to achieve the maximum signal-to-noise ratio (SNR), and an acceptable bandwidth-limitation. However, the purpose of minimizing the distortion exhibits some conflicts with that of filtering the noise and the interference completely. Therefore, design of the received filters has to make a balance between the distortion and the noise.

On the other hand, the transmitted filter is used to make the bandwidth of the transmitted signal satisfy the standard in the specific spectrum. Because the transmitted signal for the digital communication is generated from a digital-to-analog converter, the transmitted filter should be designed to remove the harmonic which is generated from the operation of sample and hold of the digital-to-analog converter. In the design of the transmitted filter, the requirements for removing harmonic are decided according to the characteristics of the digital-to-analog converter, such as sampling frequency. Due to the rebuilding operation of the transmitted filter for the analog waveform (trapezoid) of the digital-to-analog converter, the transmitted filter is named as rebuilding filter as well.

Bandwidth is the most parameter for the filter design. In the conventional communication system, the bandwidth of the transmitted filter is larger than the bandwidth of the received filter. Therefore, in order to optimize the efficiency of the received filter and the transmitted filter, separable transmitted filter and separable received filter are adopted in the design of the recent transceiver. However, due to the independence of the separable transmitted filter and the separable received filter, more time is spent to switch the transmitted mode and the received mode, and the size of the transmitter and the cost of the products are also increased.

FIG. 1 shows a common system of the filtering circuit of the transmitted port and the received port in the prior invention. The filtering circuit switches the transmitted mode and the received mode to minimize circuit size through the plural switches. However, the filtering circuit is not suitable for the distinct systems.

U.S. Pat. No. 2007/0040605 A1 discloses a shared receiver and transmitter filter. In order to share the filters, the invention adopts four switches into the received circuit and the transmitted circuit to switch the transmitted mode and the received mode. However, the disclosed filter is merely suitable for the common system of the circuit of the transmitted port and the received port.

According to the above discussions, it need an apparatus and a method to overcome the disadvantage of the prior art.

SUMMARY

It is an objective of the disclosure to provide a switchable filtering circuit. The circuit can be used in the received mode and the transmitted mode for the Bluetooth system and the wireless local area network system, and can be used to decide the frequency response and the passband bandwidth for the hybrid filter.

It is another objective of the disclosure to provide an operated method of the switchable filtering circuit.

To achieve the above objective, the disclosure provides a switchable filtering circuit, in particular to the wireless local area network system and the Bluetooth system. The switchable filtering circuit comprises: a first switch, a hybrid filtering circuit, a second switch. The first switch has a first input port, a second input port, a third input port, a fourth input port, a first output port, a second output port, a third output port and a fourth output port, the first input port is electrically connected to an output port of a RF circuit of a first receiver, the second input port is electrically connected to an output port of a baseband circuit of a first transmitter, the third input port is electrically connected to an output port of a RF circuit of a second receiver, and the fourth input port is electrically connected to an output port of a baseband circuit of a second transmitter. The hybrid filtering circuit has a first input port, a second input port, a third input port, a fourth input port, a first output port, a second output port, a third output port and a fourth output port, the first input port is electrically connected to the first output port of the first switch, the second input port is electrically connected to the second output port of the first switch, the third input port is electrically connected to the third output port of the first switch, the fourth input port is electrically connected to the fourth output port of the first switch. The second switch has a first input port, a second input port, a third input port, a fourth input port, a first output port, a second output port, a third output port and a fourth output port, the first input port is electrically connected to the first output port of the hybrid filtering circuit, the second input port is electrically connected to the second output port of the hybrid filtering circuit, the third input port is electrically connected to the third output port of the hybrid filtering circuit, the fourth input port is electrically connected to the fourth output port of the hybrid filtering circuit, the first output port is electrically connected to a first input port of a baseband circuit of a first receiver, the second output port is electrically connected to an input port of a RF circuit of a first transmitter, the third output port is electrically connected to an input port of a baseband circuit of a second receiver, and the fourth output port electrically connected to an input port of a RF circuit of a second transmitter.

To achieve another objective, the disclosure provides an operation method of switchable filtering circuit, particularly used for wireless local area network system and Bluetooth system. The operation method comprises steps of: step 1: when the switchable filtering circuit as claimed in claim 1 is set as received mode for a wireless local area network system, connecting the output port of the RF circuit of the first receiver to the first input port of the first switch, connecting the first output port of the first switch to the input port of the first switchable resistor, connecting the first input port of the second switch to the first output port of the first amplifier, and connecting the first output port of the second switch to the input port of the baseband circuit of the first receiver; step 2: when the switchable filtering circuit as claimed in claim 1 is set as transmitted mode for a wireless local area network system, connecting the output port of the baseband circuit of the first transmitter to the second input port of the first switch, connecting the second output port of the first switch to the input port of the second switchable resistor, connecting the second input port of the second switch to the second output port of the first amplifier, and connecting the second output port of the second switch to the input port of the RF circuit of the first transmitter; step 3: when the switchable filtering circuit as claimed in claim 1 is set as received mode for a Bluetooth system, connecting the output port of the RF circuit of the second receiver to the third input port of the first switch, connecting the third output port of the first switch to the input port of the fifth switchable resistor, connecting the third input port of the second switch to the first output port of the second amplifier, and connecting the third output port of the second switch to the input port of the baseband circuit of the second receiver; step 4: when the switchable filtering circuit as claimed in claim 1 set as transmitted mode for a Bluetooth system, connecting the output port of the baseband circuit of the second transmitter to the fourth input port of the first switch, connecting the fourth output port of the first switch to the input port of the sixth switchable resistor, connecting the fourth input port of the second switch to the second output port of the second amplifier, and connecting the fourth output port of the second switch to the input port of the RF circuit of the second transmitter.

To sum up the above disclosures, the switchable filtering circuit and the operation method using the same according to the invention presents the following advantages:

1. Shared filter for the Bluetooth system and wireless local area network system is used to reduce circuit size and cost.

2. By using the switches with the switchable resistors and the plurality of switchable capacitors to determine the on/off status of the plurality of switchable resistors and switchable capacitors, the frequency responses and the bandwidth adjustments can be controlled and the effects of high operated freedom of the circuit and the circuit size reduction can be achieved.

These and many other advantages and features of the disclosure will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

FIG. 4.(b) shows that the switchable filtering circuit is set as transmitted mode for a wireless local area network system; FIG. 4.(c) shows that the switchable filtering circuit is set as received mode for a Bluetooth system; and FIG. 4.(d) shows that the switchable filtering circuit is set as transmitted mode for a Bluetooth system.

DETAILED DESCRIPTION

Although the invention has been explained in relation to several preferred embodiments, the accompanying drawings and the following detailed descriptions are the preferred embodiment of the disclosure. It is to be understood that the following disclosed descriptions will be examples of disclosure, and will not limit the disclosure into the drawings and the special embodiment.

Figure 1:
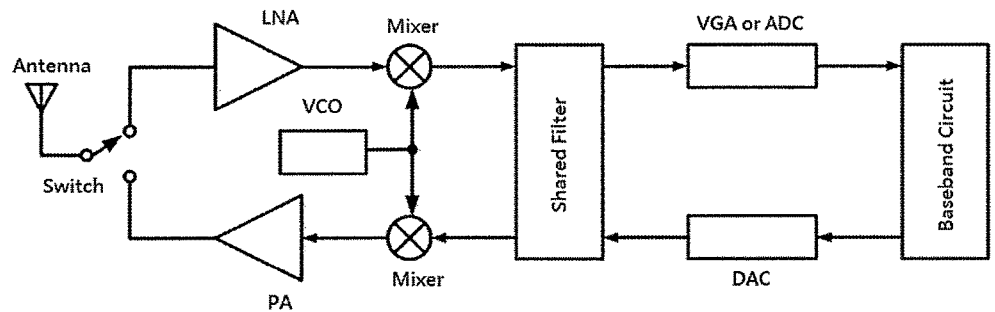
FIG. 1 shows a functional block diagram for the RF front-end system of the prior art.
Figure 2:
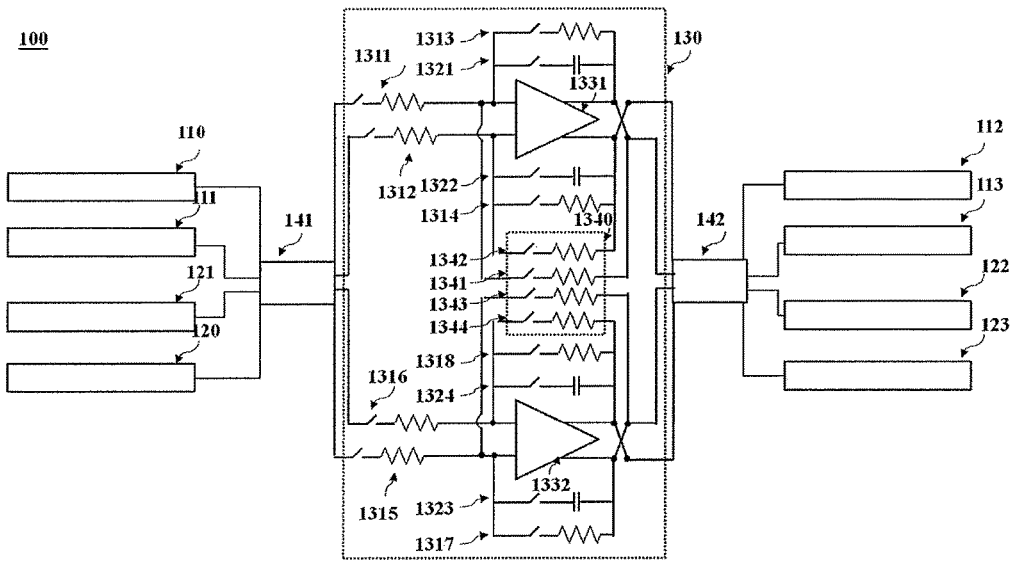
FIG. 2 shows a functional block diagram for the switchable filtering circuit of the disclosure.

To understand the spirit of the disclosure, FIG. 2 shows a switchable filtering circuit 100, in particular to the wireless local area network system and the Bluetooth system. The switchable filtering circuit 100 mainly comprises: a first switch 141, a hybrid filtering circuit 130, a second switch 142.

The first switch 141 has a first input port, a second input port, a third input port, a fourth input port, a first output port, a second output port, a third output port and a fourth output port, the first input port is electrically connected to an output port of a RF circuit of a first receiver 110, the second input port is electrically connected to an output port of a baseband circuit of a first transmitter 111, the third input port is electrically connected to an output port of a RF circuit of a second receiver 121, and the fourth input port is electrically connected to an output port of a baseband circuit of a second transmitter 120.

The hybrid filtering circuit 130 has a first input port, a second input port, a third input port, a fourth input port, a first output port, a second output port, a third output port and a fourth output port, the first input port is electrically connected to the first output port of the first switch 141, the second input port is electrically connected to the second output port of the first switch 141, the third input port is electrically connected to the third output port of the first switch 141, the fourth input port is electrically connected to the fourth output port of the first switch 141.

The second switch 142 has a first input port, a second input port, a third input port, a fourth input port, a first output port, a second output port, a third output port and a fourth output port, the first input port is electrically connected to the first output port of the hybrid filtering circuit 130, the second input port is electrically connected to the second output port of the hybrid filtering circuit 130, the third input port is electrically connected to the third output port of the hybrid filtering circuit 130, the fourth input port is electrically connected to the fourth output port of the hybrid filtering circuit 130, the first output port is electrically connected to a first input port of a baseband circuit of a first receiver 112, the second output port is electrically connected to an input port of a RF circuit of a first transmitter 113, the third output port is electrically connected to an input port of a baseband circuit of a second receiver 122, and the fourth output port is electrically connected to an input port of a RF circuit of a second transmitter 123.

The hybrid filtering circuit 130 comprises: a first switchable resistor 1311, a second switchable resistor 1312, a first amplifier 1331, a first switchable capacitor 1321, a third switchable resistor 1313, a second switchable capacitor 1322, a fourth switchable resistor 1314, a fifth switchable resistor 1315, a sixth switchable resistor 1316, a second amplifier 1332, a third switchable capacitor 1323, a seventh switchable resistor 1317, a fourth switchable capacitor 1324, a eighth switchable resistor 1318, a plurality of array of shared and switchable resistors 1340.

Wherein, the first switchable resistor 1311 has an input port and an output port, the input port is electrically connected to the first output port of the first switch 141. The second switchable resistor 1312 has an input port and an output port, the input port is electrically connected to the second output port of the first switch 141. The first amplifier 1331 has a first input port, a second input port, a first output port and a second output port, the first input port is electrically connected to the output port of the first switchable resistor 1311, and the second input port is electrically connected to the output port of the second switchable resistor 1312. The first switchable capacitor 1321 has an input port and an output port, the input port is electrically connected to the first input port of the first amplifier 1331, and the output port is electrically connected to the first output port of the first amplifier 1331. The third switchable resistor 1313 has an input port and an output port, the input port is electrically connected to the first input port of the first amplifier 1331, and the output port is electrically connected to the first output port of the first amplifier 1331. The second switchable capacitor 1322 has an input port and an output port, the input port is electrically connected to the second input port of the first amplifier 1331, and the output port is electrically connected to the second output port of the first amplifier 1331. The fourth switchable resistor 1314 has an input port and an output port, the input port is electrically connected to the second input port of the first amplifier 1331, and the output port is electrically connected to the second output port of the first amplifier 1331. The fifth switchable resistor 1315 has an input port and an output port, the input port is electrically connected to the third output port of the first switch 141. The sixth switchable resistor has an input port and an output port, the input port is electrically connected to the fourth output port of the first switch 141. The second amplifier 1332 has a first input port, a second input port, a first output port and a second output port, the first input port is electrically connected to the output port of the fifth switchable resistor 1315, and the second input port is electrically connected to the output port of the sixth switchable resistor 1316. The third switchable capacitor 1323 has an input port and an output port, the input port is electrically connected to the first input port of the second amplifier 1332, and the output port is electrically connected to the first output port of the second amplifier 1332. The seventh switchable resistor 1317 has an input port and an output port, the input port is electrically connected to the first input port of the second amplifier 1332, and the output port is electrically connected to the first output port of the second amplifier 1332. The fourth switchable capacitor 1314 has an input port and an output port, the input port is electrically connected to the second input port of the second amplifier 1332, and the output port is electrically connected to the second output port of the second amplifier 1332. The eighth switchable resistor 1318 has an input port and an output port, the input port is electrically connected to the second input port of the second amplifier 1332, and the output port is electrically connected to the second output pot of the second amplifier 1332. The plurality of array of shared and switchable resistors 1340 has a first input port, a second input port, a third input port, a fourth input port, a first output port, a second output port, a third output port and a fourth output port, the first input port is electrically connected to the output port of the first switchable resistor 1311, the second input port is electrically connected to the output port of the second switchable resistor 1312, the third input port is electrically connected the output port of the fifth switchable resistor 1315, the fourth input port is electrically connected to the output port of the sixth switchable resistor 1316, the first output port electrically connected to the first output port of the first amplifier 1331, the second output port is electrically connected to the second output port of the first amplifier 1331, the third output port is electrically connected to the first output port of the second amplifier 1332, and the fourth output port is electrically connected to the second output port of the second amplifier 1332. Wherein the first switchable resistor 1311, the second switchable resistor 1312, the third switchable resistor 1313, the fourth switchable resistor 1314, the fifth switchable resistor 1315, the sixth switchable resistor 1316, the seventh switchable resistor 1317, the eighth switchable resistor 1318, the first switchable capacitor 1321, the second switchable capacitor 1322, the third switchable capacitor 1323 and the fourth switchable capacitor 1324 all have a switch for each other. The corresponding switches determine the on/off statuses of the first switchable resistor 1311, the second switchable resistor 1312, the third switchable resistor 1313, the fourth switchable resistor 1314, the fifth switchable resistor 1315, the sixth switchable resistor 1316, the seventh switchable resistor 1317, the eighth switchable resistor 1318, the first switchable capacitor 1321, the second switchable capacitor 1322, the third switchable capacitor 1323 and the fourth switchable capacitor 1324.

In addition, the plurality of array of shared and switchable resistors 1340 comprises: a first shared and switchable resistor 1341, a second shared and switchable resistor 1342, the third shared and switchable resistor 1343, a fourth shared and switchable resistor 1344. The first shared and switchable resistor 1341 has an input port and an output port, the input port is electrically connected to the output port of the first switchable resistor 1311, and the output port is electrically connected to the first output port of the first amplifier 1331. The second shared and switchable resistor 1342 has an input port and an output port, the input port is electrically connected to the output port of the second switchable resistor 1312, and the output port is electrically connected to the second output port of the first amplifier 1331. The third shared and switchable resistor 1343 has an input port and an output port, the input port is electrically connected to the output port of the fifth switchable resistor 1315, and the output port is electrically connected to the first output port of the second amplifier 1332. The fourth shared and switchable resistor 1344, having an input port and an output port, the input port is electrically connected to the output port of the sixth switchable resistor 1316, and the output port is electrically connected to the second output port of the second amplifier 1332. Wherein the first shared and switchable resistor 1341, the second shared and switchable resistor 1342, the third shared and switchable resistor 1343 and the fourth shared and switchable resistor 1344 all have a switch for each other. The corresponding switches determine the on/off statuses of the first shared and switchable resistor 1341, the second shared and switchable resistor 1342, the third shared and switchable resistor 1343 and the fourth shared and switchable resistor 1344.

In general, the hybrid filtering circuit 130 can be formed as a high-stage filtering circuit by cascading the hybrid filtering circuit 130 constantly. However, the resistance values of the first switchable resistor 1311, the resistance values of the second switchable resistor 1312, the resistance values of the third switchable resistor 1313 and the resistance values of the fourth switchable resistor 1314 equal to each other. The capacitance values of the first switchable capacitor 1321 and the capacitance values of the second switchable capacitor 1322 equal to each other. The resistance values of the fifth switchable resistor 1315, the resistance values of the sixth switchable resistor 1316, the resistance values of the seventh switchable resistor 1317 and the resistance values of the eighth switchable resistor 1318 equal to each other. The capacitance values of the third switchable capacitor 1323 and the capacitance values of the fourth switchable capacitor 1324 equal to each other. The resistance values of the first shared and switchable resistor 1341, the resistance values of the second shared and switchable resistor 1342, the resistance values of the third shared and switchable resistor 1343 and the resistance values of the fourth shared and switchable resistor 1344 equal to each other.

The adopted filter of the disclosure is formed as an active filter through an operational amplifier, a feedback resistor array and a feedback capacitor array. Note also here, the disclosure also discloses a shared and switchable resistor array to satisfy the operation of the dual-system simultaneously.

For the characteristic of the active filter, when the hybrid filtering circuit 130 is set as a low-pass filter, the passband bandwidth of the low-pass filter defined according to the reciprocal of the product of the values of the resistance from the first switchable resistor 1311, the second switchable resistor 1312, the third switchable resistor 1313 and the fourth switchable resistor 1314 and the values of the capacitance from the first switchable capacitor 1321 and the second switchable capacitor 1322. When the hybrid filtering circuit 130 is set as a bandpass filter, the passband bandwidth of the bandpass filter defined according to the reciprocal of the product of the values of the resistance from the first shared and switchable resistor 1311, the second shared and switchable resistor 1312, the third shared and switchable resistor 1313 and the fourth shared and switchable resistor 1314 and the values of the capacitance from the first switchable capacitor 1321 and the second switchable capacitor 1322.

Figure 3:
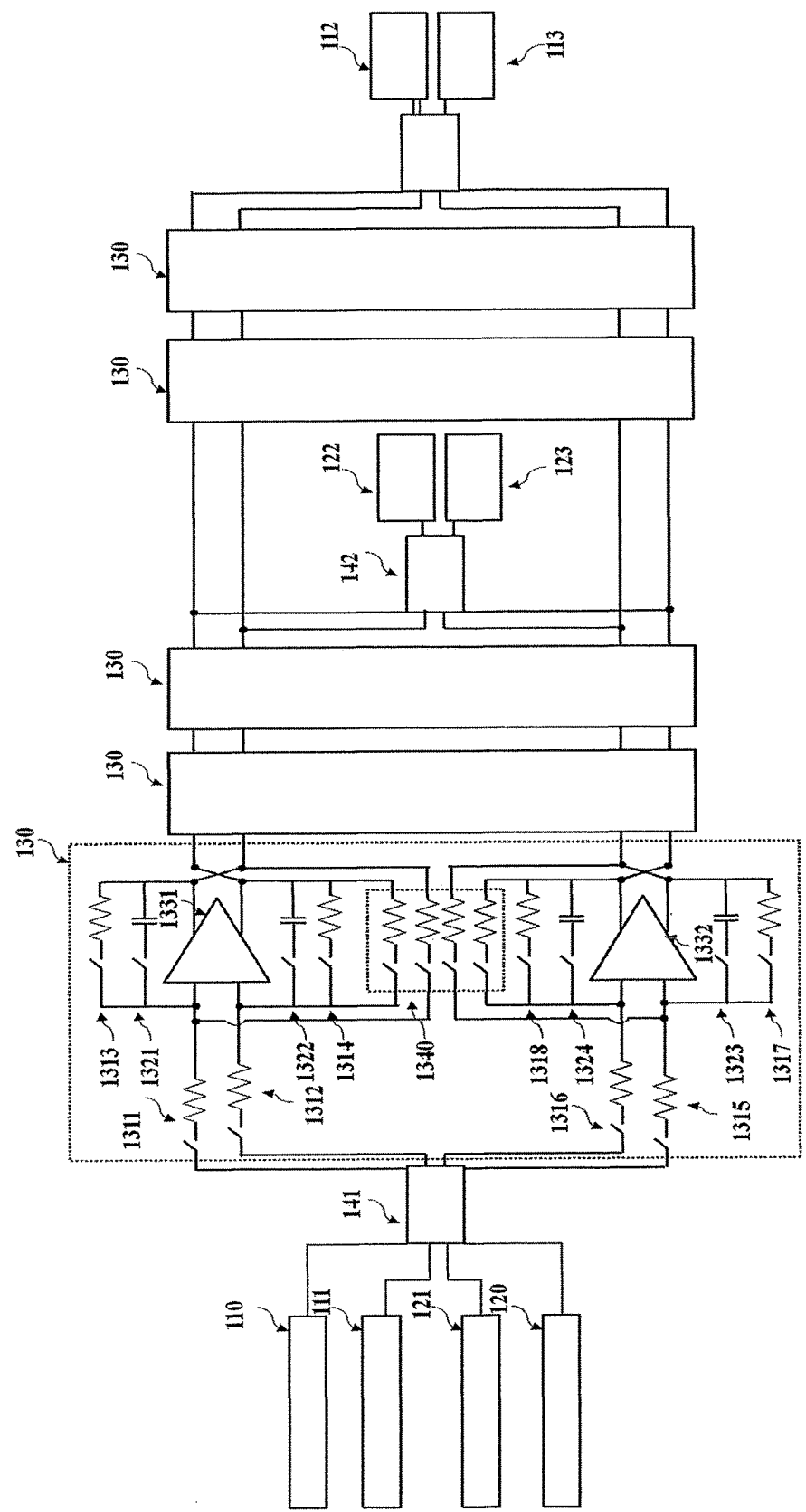
FIG. 3 shows a functional block diagram for an embodiment of the switchable filtering circuit of the disclosure.
Figure 4A:
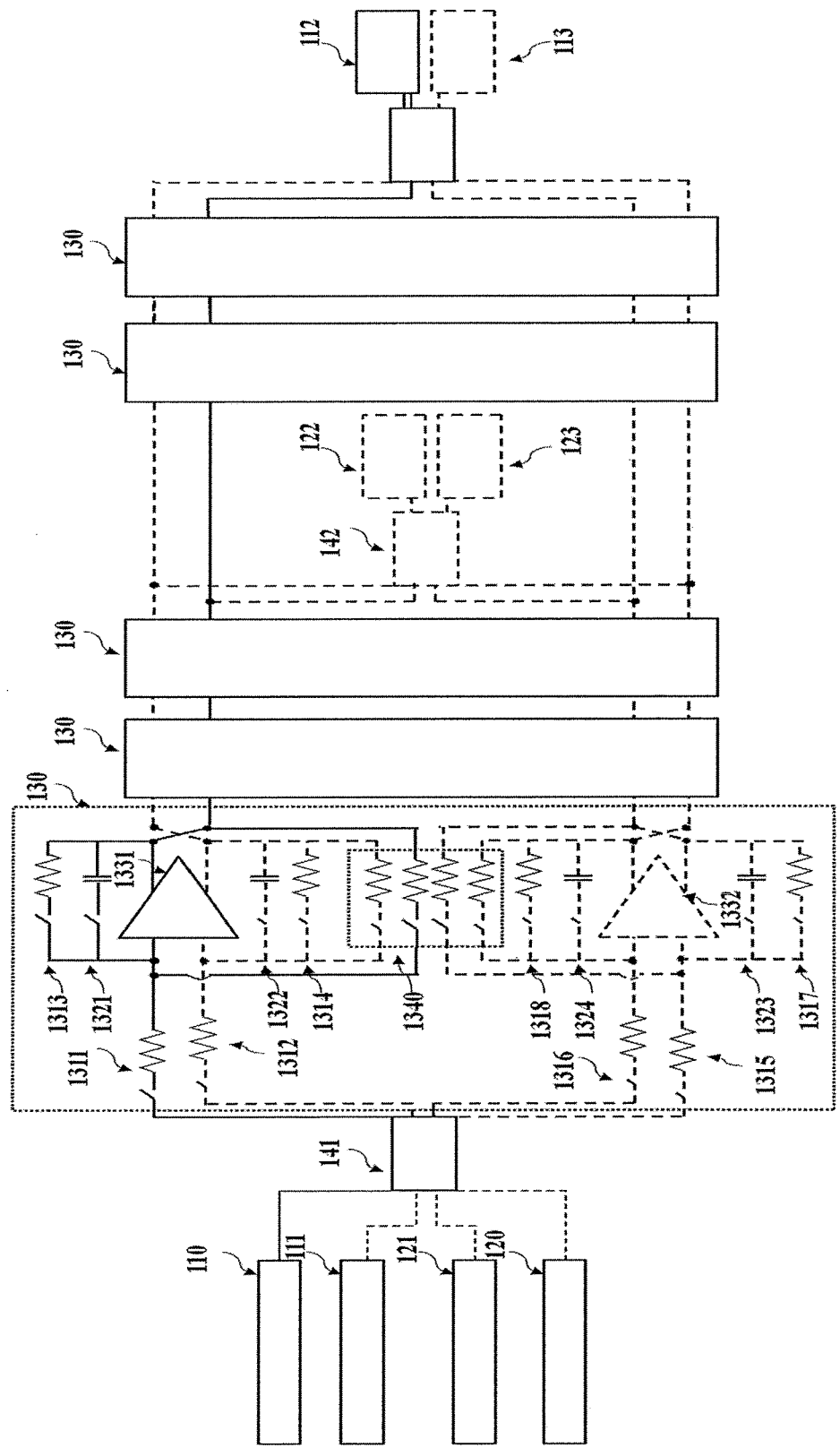
FIG. 4 shows a functional block diagram for another embodiment of the circuit operation of the switchable filtering circuit of the disclosure, wherein FIG. 4.(a) shows that the switchable filtering circuit is set as received mode for a wireless local area network system.
Figure 4B:
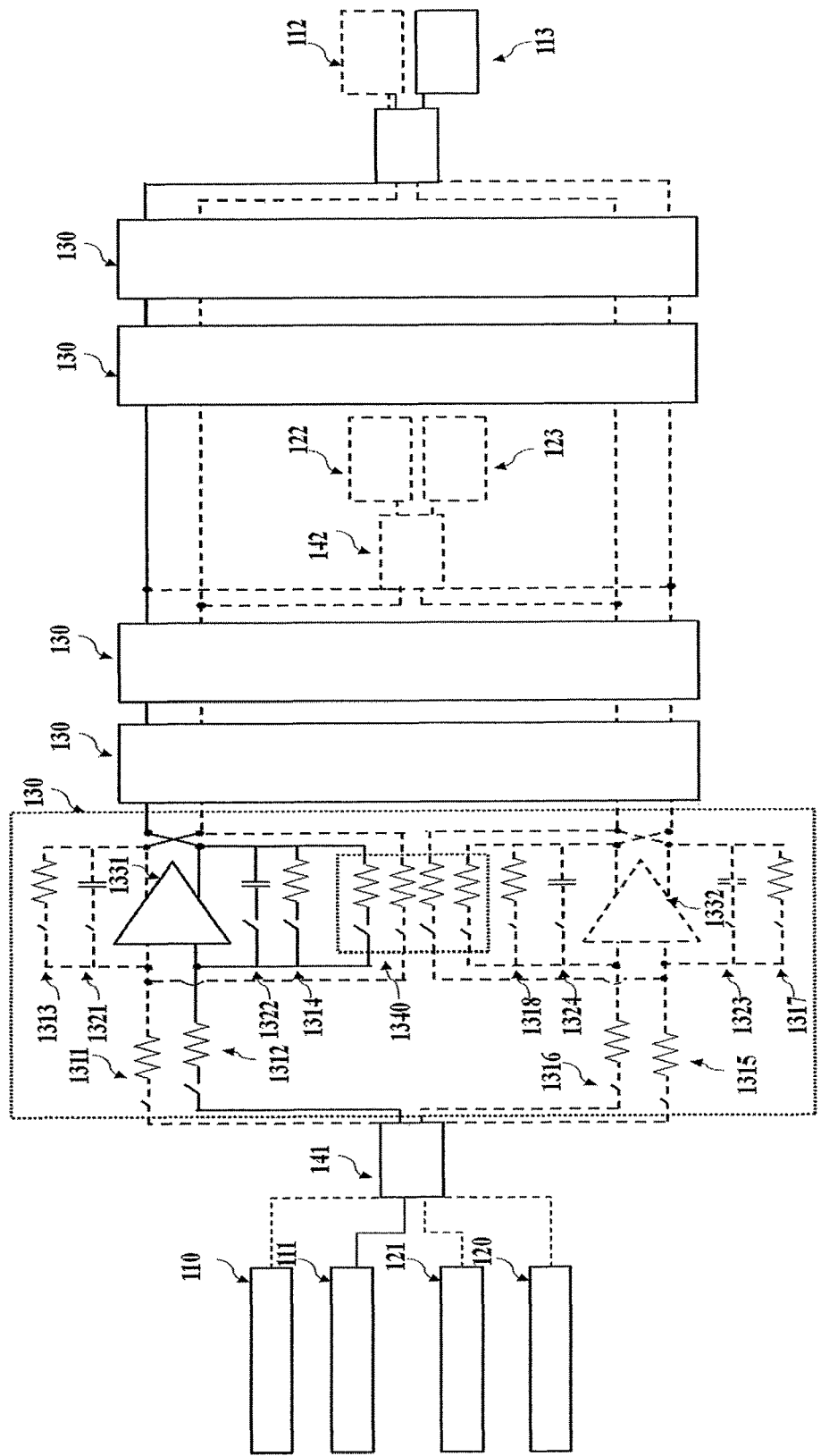
Figure 4C:
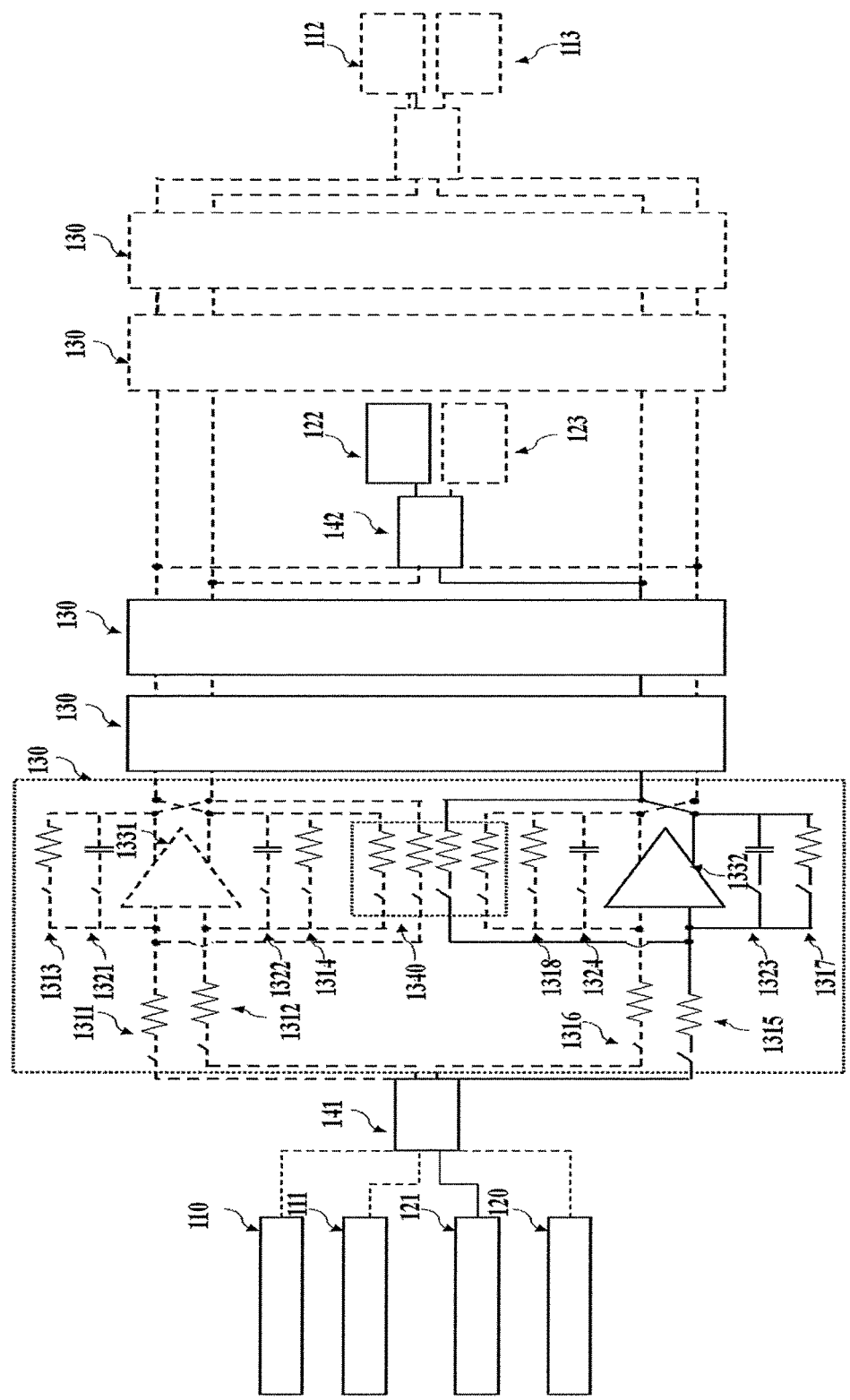
Figure 4D:
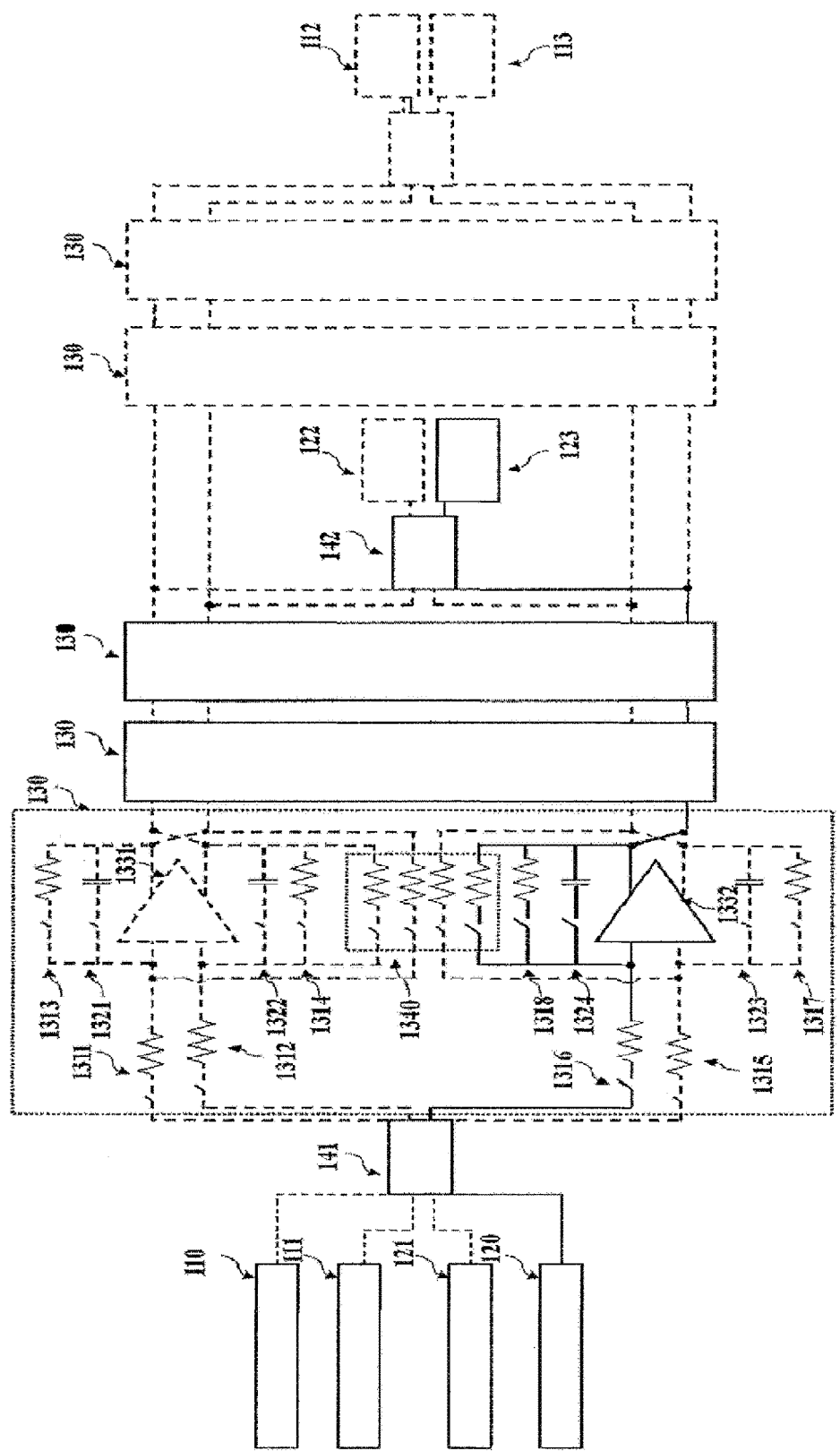

FIG. 3 shows a functional block diagram for an embodiment of the switchable filtering circuit of the disclosure. The RF circuit of the first receiver 110 and the baseband circuit of the first transmitter 111 are the RF front-end receiver and transmitter for the wireless local area network system, respectively, and the RF circuit of the second receiver 121 and the baseband circuit of the second transmitter 120 are the RF front-end receiver and transmitter for the Bluetooth system, respectively. For the embodiment, three-stage filter is used for Bluetooth system, and five-stage filter is used for wireless local area network system, however, the above three-stage and five-stage filter can be built by cascading two hybrid filtering circuit 130 and four hybrid filtering circuit 130, respectively. Note also here, due to the high-stage filter for the wireless local area network system, a third switch is used to switch the operated mode after cascading four hybrid filtering circuit 130. In addition, the bandwidth of the hybrid filtering circuit 130 is set as 5 MHz, 10 MHz or 20 MHz for the wireless local area network system, and exhibits a bandwidth range from 600 KHz to 1 MHz for Bluetooth system.

To further understand the spirit of the disclosure, an operation method of the switchable filtering circuit is provided, particularly used for wireless local area network system and Bluetooth system, wherein comprising steps of:

step 1: when the switchable filtering circuit 100 is set as received mode for a wireless local area network system, connecting the output port of the RF circuit of the first receiver 110 to the first input port of the first switch 141, connecting the first output port of the first switch 141 to the input port of the first switchable resistor 1311, connecting the first input port of the second switch 142 to the first output port of the first amplifier 1331, and connecting the first output port of the second switch 142 to the input port of the baseband circuit of the first receiver 112; step 2: when the switchable filtering circuit 100 is set as transmitted mode for a wireless local area network system, connecting the output port of the baseband circuit of the first transmitter 111 to the second input port of the first switch 141, connecting the second output port of the first switch 141 to the input port of the second switchable resistor 1312, connecting the second input port of the second switch 142 to the second output port of the first amplifier 1331, and connecting the second output port of the second switch 142 to the input port of the RF circuit of the first transmitter 113; step 3: when the switchable filtering circuit 100 is set as received mode for a Bluetooth system, connecting the output port of the RF circuit of the second receiver 121 to the third input port of the first switch 141, connecting the third output port of the first switch 141 to the input port of the fifth switchable resistor 1315, connecting the third input port of the second switch 142 to the first output port of the second amplifier 1332, and connecting the third output port of the second switch 142 to the input port of the baseband circuit of the second receiver 122; and step 4: when the switchable filtering circuit 100 is set as transmitted mode for a Bluetooth system, connecting the output port of the baseband circuit of the second transmitter 120 to the fourth input port of the first switch 141, connecting the fourth output port of the first switch 141 to the input port of the sixth switchable resistor 1316, connecting the fourth input port of the second switch 142 to the second output port of the second amplifier 1332, and connecting the fourth output port of the second switch 142 to the input port of the RF circuit of the second transmitter 123.

When the hybrid filtering circuit 130 is set as a low-pass filter, the step further comprises the steps of:

step 1-1: when setting as received mode for a wireless local area network system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the first switchable capacitor 1321 and the second switchable capacitor 1322, and turning on one of the first switchable resistor 1311, the second switchable resistor 1312, the third switchable resistor 1313 and the fourth switchable resistor 1314; step 2-1: when setting as transmitted mode for a wireless local area network system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the first switchable capacitor 1321 and the second switchable capacitor 1322, and turning on one of the first switchable resistor 1311, the second switchable resistor 1312, the third switchable resistor 1313 and the fourth switchable resistor 1314; step 3-1: when setting as received mode for a Bluetooth system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the third switchable capacitor 1323 and the fourth switchable capacitor 1324, and turning on one of the fifth switchable resistor 1315, the sixth switchable resistor 1316, the seventh switchable resistor 1317 and the eighth switchable resistor 1318; and step 4-1: when setting as transmitted mode for a Bluetooth system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the third switchable capacitor 1323 and the fourth switchable capacitor 1324, and turning on one of the fifth switchable resistor 1315, the sixth switchable resistor 1316, the seventh switchable resistor 1317 and the eighth switchable resistor 1318.

When the hybrid filtering circuit 130 is set as a bandpass filter, the step further comprises the steps of:

step 1-1: when setting as received mode for a wireless local area network system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the first switchable capacitor 1321 and the second switchable capacitor 1322, and turning on one of the first switchable resistor 1311, the second switchable resistor 1312, the third switchable resistor 1313 and the fourth switchable resistor 1314; step 2-1: when setting as transmitted mode for a wireless local area network system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the first switchable capacitor 1321 and the second switchable capacitor 1322, and turning on one of the first switchable resistor 1311, the second switchable resistor 1312, the third switchable resistor 1313 and the fourth switchable resistor 1314; step 3-1: when setting as received mode for a Bluetooth system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the third switchable capacitor 1323 and the fourth switchable capacitor 1324, and turning on one of the fifth switchable resistor 1315, the sixth switchable resistor 1316, the seventh switchable resistor 1317 and the eighth switchable resistor 1318; and step 4-1: when setting as transmitted mode for a Bluetooth system, turning on the first shared and switchable resistor 1341, the second shared and switchable resistor 1342, the third shared and switchable resistor 1343 and the fourth shared and switchable resistor 1344 within the plurality of array of shared and switchable resistors 1340, turning on one of the third switchable capacitor 1323 and the fourth switchable capacitor 1324, and turning on one of the fifth switchable resistor 1315, the sixth switchable resistor 1316, the seventh switchable resistor 1317 and the eighth switchable resistor 1318.

FIG. 4 shows a functional block diagram for another embodiment of the circuit operation of the switchable filtering circuit of the disclosure. For the embodiment, three-stage filter is used for Bluetooth system, and five-stage filter is used for wireless local area network system, however, the above three-stage and five-stage filter can be built by cascading two hybrid filtering circuit 130 and four hybrid filtering circuit 130, respectively. Note also here, due to the high-stage filter for the wireless local area network system, a third switch is used to switch the operated mode after cascading four hybrid filtering circuit 130.

FIG. 4.(*a*) shows that when the switchable filtering circuit 100 is set as received mode for a wireless local area network system, the output port of the RF circuit of the first receiver 110 is electrically connected to the first input port of the first switch 141, the first output port of the first switch 141 is electrically connected to the input port of the first switchable resistor 1311, the first input port of the second switch 142 is electrically connected to the first output port of the first amplifier 1331, and the first output port of the second switch 142 is electrically connected to the input port of the baseband circuit 112 of the first receiver;

FIG. 4.(*b*) shows that when the switchable filtering circuit 100 is set as transmitted mode for a wireless local area network system, the output port of the baseband circuit of the first transmitter 111 is electrically connected to the second input port of the first switch 141, the second output port of the first switch 141 is electrically connected to the input port of the second switchable resistor 1312, the second input port of the second switch 142 is electrically connected to the second output port of the first amplifier 1331, and the second output port of the second switch 142 is electrically connected to the input port of the RF circuit 113 of the first transmitter;

FIG. 4.(*c*) shows that when the switchable filtering circuit 100 is set as received mode for a Bluetooth system, the output port of the RF circuit of the second receiver 121 is electrically connected to the third input port of the first switch 141, the third output port of the first switch 141 is electrically connected to the input port of the fifth switchable resistor 1315, the third input port of the second switch 142 is electrically connected to the first output port of the second amplifier 1332, and the third output port of the second switch 142 is electrically connected to the input port of the baseband circuit 122 of the second receiver; and FIG. 4.(*d*) shows that when the switchable filtering circuit 100 is set as transmitted mode for a Bluetooth system, the output port of the baseband circuit of the second transmitter 120 is electrically connected to the fourth input port of the first switch 141, the fourth output port of the first switch 141 is electrically connected to the input port of the sixth switchable resistor 1316, the fourth input port of the second switch 142 is electrically connected to the second output port of the second amplifier 1332, and the fourth output port of the second switch 142 is electrically connected to the input port of the RF circuit 123 of the second transmitter.

Note also here, the transistors of above active circuit can be implemented by using 0.18 .mu.m, 0.13 .mu.m, 0.09 .mu.m, 0.0045 .mu.m, or more advanced process, wherein the transistor can be implemented as: Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS). Preferably, PHEMT is suitable for the gain stage and power stage in the microwave to millimeter wave range. Semiconductor materials broadly applicable to the gain stage and power stage include: silicon, silicon-on-insulator (SOI), silicon-germanium (SiGe), gallium arsenide (GaAs), indium phosphide (InP) and silicon-germanium-carbon (SiGe—C) materials.

Although the invention has been explained in relation to its preferred embodiment, it is not used to limit the invention. It is to be understood that many other possible modifications and variations can be made by those skilled in the art without departing from the spirit and scope of the invention as hereinafter claimed.

The invention claimed is:
1. A switchable filtering circuit, used for wireless local area network (LAN) system and Bluetooth system, comprising:
   a first switch configured to receive a plurality of input signals from the wireless LAN system and the Bluetooth system;
   a second switch having outputs coupled with the wireless LAN system and further outputs coupled with the Bluetooth system;
   a first plurality of cascaded controllable hybrid filtering circuits having first inputs coupled with outputs of the first switch and having first outputs generating first output signals; and
   a second plurality of cascaded controllable hybrid filtering circuits having second inputs coupled with the first outputs of the first plurality of cascaded controllable hybrid filtering circuits and having second outputs generating second output signals,
   wherein a first of the second outputs of the second plurality of cascaded controllable hybrid filtering circuits is coupled with a first input of the second switch and wherein a second of the second outputs of the second plurality of cascaded controllable hybrid filtering circuits is coupled with a second input of the second switch and wherein a first of the first outputs of the first plurality of cascaded controllable hybrid filtering circuits is coupled with a third input of the second switch and wherein a second of the first outputs of the first plurality of cascaded controllable hybrid filtering circuits is coupled with a fourth input of the second switch;
   wherein in a wireless LAN operating mode, output signals from the wireless LAN system are selected by the first switch and output signals from the second plurality of cascaded controllable hybrid filtering circuits are selected through the second switch as further input signals for the wireless LAN system; and
   in a Bluetooth operating mode, output signals from the Bluetooth system are selected by the first switch and first output signals from the first plurality of cascaded controllable hybrid filtering circuits are selected through the second switch as further input signals for the Bluetooth system,
   wherein each hybrid filtering circuit of the first and second plurality of cascaded controllable hybrid filtering circuits comprises a first and a second amplifier, wherein each amplifier is shared by two active filter circuits formed within each hybrid filtering circuit,
   wherein
   the first switch comprises four input ports and four output ports, wherein a first input port is electrically connected to an output port of an RF circuit of a first receiver, a second input port is electrically connected to an output port of a baseband circuit of a first transmitter, a third input port electrically connected to an output port of an RF circuit of a second receiver, and wherein a fourth input port is electrically connected to an output port of a baseband circuit of a second transmitter;
   a first cascaded controllable hybrid filtering circuit of the first plurality of cascaded controllable hybrid filtering circuits comprises four input ports coupled with the four output ports of the first switch, respectively and further comprises four output ports;
   a second cascaded controllable hybrid filtering circuit of the second plurality of cascaded controllable hybrid filtering circuits comprises four input ports coupled with the four output ports of a last controllable hybrid filtering circuit of the first plurality of cascaded controllable hybrid filtering circuits, respectively and further comprises four output ports;
   the second switch comprises four input ports and four output ports, wherein a third and a fourth input port of the second switch are electrically connected to third and fourth output ports of the last controllable hybrid filtering circuit of the first plurality of cascaded controllable hybrid filtering circuits, respectively, and a third and a fourth output port of the second switch are electrically connected to an input port of a baseband circuit of a second receiver and an input port of an RF circuit of a second transmitter, respectively and a first and a second input port of the second switch are electrically connected to a first and a second output port of a last controllable hybrid filtering circuit of the second plurality of cascaded controllable hybrid filtering circuits, respectively, and a first and second output ports are electrically connected to an input port of a baseband circuit of a first receiver and to an input port of an RF circuit of a first transmitter, respectively.

2. The switchable filtering circuit according to claim 1, wherein the first plurality of cascaded controllable hybrid filtering circuits consists of three cascaded controllable hybrid filtering circuits coupled in series.

3. The switchable filtering circuit according to claim 1, wherein the second plurality of cascaded controllable hybrid filtering circuits consists of two cascaded controllable hybrid filtering circuits coupled in series.

4. The switchable filtering circuit according to claim 1, wherein the first plurality of cascaded controllable hybrid filtering circuits consists of three controllable hybrid filtering circuits coupled in series and the second plurality of cascaded controllable hybrid filtering circuits consists of two controllable hybrid filtering circuits coupled in series.

5. The switchable filtering circuit according to claim 1, wherein the LAN system comprises the first transmitter and the first receiver.

6. The switchable filtering circuit according to claim 1, wherein the wireless Bluetooth system comprises the second transmitter and the second receiver.

7. The switchable filtering circuit as claimed in claim 1, wherein each hybrid filtering circuit of said first and second plurality of cascaded controllable hybrid filtering circuits further comprises: a first switchable resistor, having an input port and an output port, the input port electrically connected to a first output port of the first switch or a first output port of a preceding hybrid filtering circuit; a second switchable resistor, having an input port and an output port, the input port electrically connected to a second output port of the first switch or a second output port of a preceding hybrid filtering circuit; a first amplifier, having a first input port, a second input port, a first output port and a second output port, the first input port electrically connected to the output port of the first switchable resistor, and the second input port electrically connected to the output port of the second switchable resistor; a first switchable capacitor, having an input port and an output port, the input port electrically connected to the first input port of the first amplifier, and the output port electrically connected to the first output port of the first amplifier; a third switchable resistor, having an input port and an output port, the input port electrically connected to the first input port of the first amplifier, and the output port electrically connected to the first output port of the first amplifier; a second switchable capacitor, having an input port and an output port, the input port electrically connected to the second input port of the first amplifier, and the output port electrically connected to the second output port of the first amplifier; a fourth switchable resistor, having an input port and an output port, the input port electrically connected to the second input port of the first amplifier, and the output port electrically connected to the second output port of the first amplifier; a fifth switchable resistor, having an input port and an output port, the input port electrically connected to the third output port of the first switch or a third output port of a preceding hybrid filtering circuit; a sixth switchable resistor, having an input port and an output port, the input port electrically connected to the fourth output port of the first switch or a fourth output port of a preceding hybrid filtering circuit; a second amplifier, having a first input port, a second input port, a first output port and a second output port, the first input port electrically connected to the output port of the fifth switchable resistor, and the second input port electrically connected to the output port of the sixth switchable resistor; a third switchable capacitor, having an input port and an output port, the input port electrically connected to the first input port of the second amplifier, and the output port electrically connected to the first output port of the second amplifier; a seventh switchable resistor, having an input port and an output port, the input port electrically connected to the first input port of the second amplifier, and the output port electrically connected to the first output port of the second amplifier; a fourth switchable capacitor, having an input port and an output port, the input port electrically connected to the second input port of the second amplifier, and the output port electrically connected to the second output port of the second amplifier; a eighth switchable resistor, having an input port and an output port, the input port electrically connected to the second input port of the second amplifier, and the output port electrically connected to the second output port of the second amplifier; a plurality of array of shared and switchable resistors, having a first input port, a second input port, a third input port, a fourth input port, a first output port, a second output port, a third output port and a fourth output port, the first input port electrically connected to the output port of the first switchable resistor, the second input port electrically connected to the output port of the second switchable resistor, the third input port electrically connected the output port of the fifth switchable resistor, the fourth input port electrically connected to the output port of the sixth switchable resistor, the first output port electrically connected to the first output port of the first amplifier, the second output port electrically connected to the second output port of the first amplifier, the third output port electrically connected to the first output port of the second amplifier, and the fourth output port electrically connected to the second output port of the second amplifier; and wherein switching of the first switchable resistor, the second switchable resistor, the third switchable resistor, the fourth switchable resistor, the fifth switchable resistor, the sixth switchable resistor, the seventh switchable resistor, the eighth switchable resistor, the first switchable capacitor, the second switchable capacitor, the third switchable capacitor and the fourth switchable capacitor is performed by a respective switch.

8. The switchable filtering circuit as claimed in claim 7, wherein values of the first switchable resistor, the second switchable resistor, the third switchable resistor and the fourth switchable resistor in at least one of the controllable filtering circuits are equal to each other.

9. The switchable filtering circuit as claimed in claim 7, wherein values of the first switchable capacitor and the second switchable capacitor in at least one of the controllable filtering circuits are equal to each other.

10. The switchable filtering circuit as claimed in claim 7, wherein values of the fifth switchable resistor, the sixth switchable resistor, the seventh switchable resistor and the eighth switchable resistor in at least one of the controllable filtering circuits are equal to each other.

11. The switchable filtering circuit as claimed in claim 7, wherein values of the third switchable capacitor and the fourth switchable capacitor in at least one of the controllable filtering circuits are equal to each other.

12. The switchable filtering circuit as claimed in claim 7, wherein the plurality of array of shared and switchable resistors further comprises:
a first shared and switchable resistor, having an input port and an output port, the input port electrically connected to the output port of the first switchable resistor, and the output port electrically connected to the first output port of the first amplifier;
a second shared and switchable resistor, having an input port and an output port, the input port electrically connected to the output port of the second switchable resistor, and the output port electrically connected to the second output port of the first amplifier;
a third shared and switchable resistor, having an input port and an output port, the input port electrically connected to the output port of the fifth switchable resistor, and the output port electrically connected to the first output port of the second amplifier; and
a fourth shared and switchable resistor, having an input port and an output port, the input port electrically connected to the output port of the sixth switchable resistor, and the output port electrically connected to the second output port of the second amplifier;
wherein the first shared and switchable resistor, the second shared and switchable resistor, the third shared and switchable resistor and the fourth shared and switchable resistor are each coupled in series with a respective switch.

13. The switchable filtering circuit as claimed in claim 12, wherein values of the first shared and switchable resistor, the second shared and switchable resistor, the third shared and switchable resistor and the fourth shared and switchable resistor in at least one of the controllable filtering circuits are equal to each other.

14. The switchable filtering circuit as claimed in claim 7, when the hybrid filtering circuit is set as a low-pass filter, the passband bandwidth of the low-pass filter defined according to the reciprocal of the product of values of the resistance from the first switchable resistor, the second switchable resistor, the third switchable resistor and the fourth switchable resistor and the capacitance from the first switchable capacitor and the second switchable capacitor.

15. The switchable filtering circuit as claimed in claim 7, when each hybrid filtering circuit is configured to be set as a bandpass filter, a passband bandwidth of the bandpass filter being defined by resistance values of the first shared and switchable resistor, the second shared and switchable resistor, the third shared and switchable resistor and the fourth shared and switchable resistor and the capacitance values of the first switchable capacitor and the second switchable capacitor.

16. An operation method for a switchable filtering circuit according to claim 7, wherein when the hybrid filtering circuit is set as a low-pass filter, comprising the steps of:

in a first operating mode, when setting the switchable filtering circuit into a mode for a wireless local area network system, turning on a first shared and switchable resistor, a second shared and switchable resistor, the third shared and switchable resistor and the fourth shared and switchable resistor within the plurality of array of shared and switchable resistors, turning on one of the first switchable capacitor and the second switchable capacitor, and turning on one of the first switchable resistor, the second switchable resistor, the third switchable resistor and the fourth switchable resistor;

in a second operating mode, when setting the switchable filtering circuit into a transmitter mode for a wireless local area network system, turning on the first shared and switchable resistor, the second shared and switchable resistor, the third shared and switchable resistor and the fourth shared and switchable resistor within the plurality of array of shared and switchable resistors, turning on one of the first switchable capacitor and the second switchable capacitor, and turning on one of the first switchable resistor, the second switchable resistor, the third switchable resistor and the fourth switchable resistor;

in a third operating mode, when setting the switchable filtering circuit into a receiver mode for a Bluetooth system, turning on the first shared and switchable resistor, the second shared and switchable resistor, the third shared and switchable resistor and the fourth shared and switchable resistor within the plurality of array of shared and switchable resistors, turning on one of the third switchable capacitor and the fourth switchable capacitor, and turning on one of the fifth switchable resistor, the sixth switchable resistor, the seventh switchable resistor and the eighth switchable resistor; and in a fourth operating mode, when setting the switchable filtering circuit into a transmitter mode for a Bluetooth system, turning on the first shared and switchable resistor, the second shared and switchable resistor, the third shared and switchable resistor and the fourth shared and switchable resistor within the plurality of array of shared and switchable resistors, turning on one of the third switchable capacitor and the fourth switchable capacitor, and turning on one of the fifth switchable resistor, the sixth switchable resistor, the seventh switchable resistor and the eighth switchable resistor.

17. An operation method for a switchable filtering circuit according to claim 7, wherein when the hybrid filtering circuit is set as a bandpass filter, further comprises steps of:

in a first operating mode, when setting the switchable filtering circuit into a receiver mode for a wireless local area network system, turning on the first shared and switchable resistor, the second shared and switchable resistor, the third shared and switchable resistor and the fourth shared and switchable resistor within the plurality of array of shared and switchable resistors, turning on one of the first switchable capacitor and the second switchable capacitor, and turning on one of the first switchable resistor, the second switchable resistor, the third switchable resistor and the fourth switchable resistor;

in a second operating mode, when setting the switchable filtering circuit into a transmitter mode for a wireless local area network system, turning on the first shared and switchable resistor, the second shared and switchable resistor, the third shared and switchable resistor and the fourth shared and switchable resistor within the plurality of array of shared and switchable resistors, turning on one of the first switchable capacitor and the second switchable capacitor, and turning on one of the first switchable resistor, the second switchable resistor, the third switchable resistor and the fourth switchable resistor;

in a third operating mode, when setting the switchable filtering circuit into a receiver mode for a Bluetooth system, turning on the first shared and switchable resistor, the second shared and switchable resistor, the third shared and switchable resistor and the fourth shared and switchable resistor within the plurality of array of shared and switchable resistors, turning on one of the third switchable capacitor and the fourth switchable capacitor, and turning on one of the fifth switchable resistor, the sixth switchable resistor, the seventh switchable resistor and the eighth switchable resistor; and in a fourth operating mode, when setting the switchable filtering circuit into a transmitter mode for a Bluetooth system, turning on the first shared and switchable resistor, the second shared and switchable resistor, the third shared and switchable resistor and the fourth shared and switchable resistor within the plurality of array of shared and switchable resistors, turning on one of the third switchable capacitor and the fourth switchable capacitor, and turning on one of the fifth switchable resistor, the sixth switchable resistor, the seventh switchable resistor and the eighth switchable resistor.

18. An operation method of switchable filtering circuit comprising a first switch configured to receive a plurality of input signals from a wireless LAN system and a Bluetooth system; a first plurality of cascaded switchable filtering circuits having first inputs coupled with outputs of the first switch and having first outputs generating first output signals coupled with inputs of a second switch having outputs coupled with the Bluetooth system; and a second plurality of cascaded switchable filtering circuits having second inputs coupled with the first outputs of the first plurality of cascaded switchable filtering circuits and having second outputs generating second output signals coupled with further inputs of the second switch having further outputs coupled with the wireless LAN system, comprising the steps of:

in a first operating mode: the first switch and the first and second plurality of cascaded switchable filtering circuits are set into a receiver mode for a wireless local area network system by connecting an output port of an RF circuit of a first receiver of the wireless LAN system to a first input port of the first switch, connecting a first output port of the first switch to a first input port of the first plurality of cascaded switchable filtering circuits, connecting a first input port of the second switch to a first output port of the second plurality of cascaded switchable filtering circuits, and by connecting a first output port of the second switch to an input port of a baseband circuit of a first receiver of the wireless LAN system;

in a second operating mode: the first switch and the first and second plurality of cascaded switchable filtering circuit are set into a transmitter mode for a wireless local area network system by connecting an output port of a baseband circuit of a first transmitter of the wireless LAN system to a second input port of the first switch, connecting a second output port of the first switch to a second input port of the first plurality of cascaded switchable filtering circuits, connecting a second input port of the second switch to a second output port of the second plurality of cascaded switchable filtering circuits, and by connecting a second output port of the second switch to an input port of an RF circuit of the first transmitter;

in a third operating mode: the first switch and the first and second plurality of cascaded switchable filtering circuit are set into a receiver mode for a Bluetooth system by connecting an output port of an RF circuit of a second receiver of the Bluetooth system to a third input port of the first switch, connecting a third output port of the first switch to a third input port of the first plurality of cascaded switchable filtering circuits, connecting a third input port of the second switch to a third output port of the first plurality of cascaded switchable filtering circuits, and by connecting a third output port of the second switch to an input port of a baseband circuit of the second receiver of the Bluetooth system; and in a fourth operating mode: the first switch and the first and second plurality of cascaded switchable filtering circuit are set into a transmitter mode for the Bluetooth system by connecting an output port of a baseband circuit of a second transmitter of the Bluetooth system to a fourth input port of the first switch, connecting a fourth output port of the first switch to a fourth input port of the first plurality of cascaded switchable filtering circuits, connecting a fourth input port of the second switch to a fourth output port of the first plurality of cascaded switchable filtering circuits, and by connecting a fourth output port of the second switch to an input port of an RF circuit of a second transmitter of the Bluetooth system, wherein each filtering circuit of the first and second plurality of cascaded switchable filtering circuits comprises a first and a second amplifier, wherein each amplifier is shared by two active filter circuits formed within each filtering circuit.

19. A switchable filtering circuit, used for wireless local area network (LAN) system and Bluetooth system, comprising:
a first switching unit configured to receive a plurality of input signals from the wireless LAN system and the Bluetooth system;
a second switching unit configured to provide output signals to the wireless LAN system and the Bluetooth system;
a first plurality of cascaded controllable hybrid filtering circuits having first inputs coupled with outputs of the first switching unit and having first outputs generating first output signals; and
a second plurality of cascaded controllable hybrid filtering circuits having second inputs coupled with the first outputs of the first plurality of cascaded controllable hybrid filtering circuits and having second outputs generating second output signals,
wherein a first of the second outputs of the second plurality of cascaded controllable hybrid filtering circuits is coupled with a first input of the second switching unit having a first output coupled with the wireless LAN system and wherein a second of the second outputs of the second plurality of cascaded controllable hybrid filtering circuits is coupled with a second input of the second switching unit having a second output coupled with the wireless LAN system and wherein a third of the first outputs of the first plurality of cascaded controllable hybrid filtering circuits is coupled with a third input of the second switching unit having a third output coupled with the wireless Bluetooth system and wherein a fourth of the first outputs of the first plurality of cascaded controllable hybrid filtering circuits is coupled with a fourth input of the second switching unit having a fourth output coupled with the Bluetooth system;

wherein in a wireless LAN receiving operating mode, an output signal from an RF circuit of a first receiver of the wireless LAN system is selected by the first switching unit and fed through the first and second plurality of cascaded controllable hybrid filtering circuits wherein the second switching unit selects an output signal from the second plurality of cascaded controllable hybrid filtering circuit as an input signal for a baseband circuit of a first receiver of the wireless LAN system;

wherein in a wireless LAN transmitting operating mode, an output signal from a baseband circuit of a first transmitter of the wireless LAN system is selected by the first switching unit and fed through the first and second plurality of cascaded controllable hybrid filtering circuits wherein the second switching unit selects an output signal from the second plurality of cascaded controllable hybrid filtering circuits as an input signal for an RF circuit of a first transmitter of the wireless LAN system;

wherein in a Bluetooth receiving operating mode, an output signal from an RF circuit of a second receiver of the Bluetooth system is selected by the first switching unit and fed through the first plurality of cascaded controllable hybrid filtering circuits wherein the second switching unit selects an output signal from the first plurality of cascaded controllable hybrid filtering circuit as an input signal for a baseband circuit of a second receiver of the Bluetooth system; and wherein in a Bluetooth transmitting operating mode, an output signal from a baseband circuit of a second transmitter of the Bluetooth system is selected by the first switching unit and fed through the first plurality of cascaded controllable hybrid filtering circuits wherein the second switching unit selects an output signal from the first plurality of cascaded controllable hybrid filtering circuits as an input signal for an RF circuit of a second transmitter of the Bluetooth system, wherein each hybrid filtering circuit of the first and second plurality of cascaded controllable hybrid filtering circuits comprises a first and a second amplifier, wherein each amplifier is shared by two active filter circuits formed within each hybrid filtering circuit, wherein
the first switching unit comprises four input ports and four output ports, wherein a first input port is electrically connected to an output port of the RF circuit of the first receiver, a second input port is electrically connected to an output port of the baseband circuit of the first transmitter, a third input port electrically connected to an output port of the RF circuit of the second receiver, and wherein a fourth input port is electrically connected to an output port of the baseband circuit of the second transmitter;

a first cascaded controllable hybrid filtering circuit of the first plurality of cascaded controllable hybrid filtering circuits comprises four input ports coupled with the four output ports of the first switching unit, respectively and further comprises four output ports;

a second cascaded controllable hybrid filtering circuit of the second plurality of cascaded controllable hybrid filtering circuits comprises four input ports coupled with the four output ports of a last controllable hybrid filtering circuit of the first plurality of cascaded controllable hybrid filtering circuits, respectively and further comprises four output ports;

the second switching unit comprises four input ports and four output ports, wherein a third and a fourth input port of the second switching unit are electrically connected to third and fourth output ports of the last controllable hybrid filtering circuit of the first plurality of cascaded controllable hybrid filtering circuits, respectively, and a third and a fourth output port of the second switch are electrically connected to an input port of the baseband circuit of the second receiver and an input port of the RF circuit of the second transmitter, respectively and a first and a second input port of the second switching unit are electrically connected to a first and a second output port of a last controllable hybrid filtering circuit of the second plurality of cascaded controllable hybrid filtering circuits, respectively, and a first and second output ports are electrically connected to an input port of the baseband circuit of the first receiver and to an input port of the RF circuit of the first transmitter, respectively.

* * * * *